(12) United States Patent
Scott et al.

(10) Patent No.: US 7,871,937 B2
(45) Date of Patent: Jan. 18, 2011

(54) PROCESS AND APPARATUS FOR TREATING WAFERS

(75) Inventors: Robin Charis Scott, Chandler, AZ (US); Matt Johnson, Tucson, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 12/331,322

(22) Filed: Dec. 9, 2008
(Under 37 CFR 1.47)

(65) Prior Publication Data
US 2009/0286406 A1    Nov. 19, 2009

Related U.S. Application Data

(60) Provisional application No. 61/053,770, filed on May 16, 2008.

(51) Int. Cl.
*H01L 21/31* (2006.01)
(52) U.S. Cl. ............... 438/759; 438/660; 438/680; 438/723; 257/E21.002
(58) Field of Classification Search ............ 438/660, 438/723, 680, 759
See application file for complete search history.

(56) References Cited

U.S. PATENT DOCUMENTS

| | | |
|---|---|---|
| 3,623,712 A | 11/1971 | McNeilly et al. |
| 3,865,072 A | 2/1975 | Kirkman |
| 4,047,496 A | 9/1977 | McNeilly |
| 4,115,163 A | 9/1978 | Gorina et al. |
| 4,210,925 A | 7/1980 | Morcom et al. |
| 4,358,686 A | 11/1982 | Kinoshita |
| 4,361,461 A | 11/1982 | Chang |
| 4,517,223 A | 5/1985 | Ovshinsky et al. |
| 4,615,905 A | 10/1986 | Ovshinsky et al. |
| 4,632,057 A | 12/1986 | Price et al. |
| 4,692,343 A | 9/1987 | Price |
| 4,699,689 A | 10/1987 | Bersin |
| 4,749,440 A | 6/1988 | Blackwood et al. |
| 4,820,377 A | 4/1989 | Davis et al. |
| 4,870,030 A | 9/1989 | Markunas et al. |

(Continued)

FOREIGN PATENT DOCUMENTS

EP    0100079 A2    2/1984

(Continued)

OTHER PUBLICATIONS

Atluri et al., Hydrogen passivation of Si(100) wafers as templates for low temperature (T<600C) epitaxy, Nuclear Instruments and Methods in Physics Research B, 1996, vol. 118, pp. 144-150.

(Continued)

*Primary Examiner*—Alexander G Ghyka
(74) *Attorney, Agent, or Firm*—Knobbe Martens Olson & Bear LLP

(57) ABSTRACT

Methods and systems are provided for low pressure baking to remove impurities from a semiconductor surface prior to deposition. Advantageously, the short, low temperature processes consume only a small portion of the thermal budget, while still proving effective at removing interfacial oxygen from the semiconductor surface. The methods and systems are particularly well suited for treating semiconductor surfaces before epitaxy.

25 Claims, 6 Drawing Sheets

U.S. PATENT DOCUMENTS

| | | | |
|---|---|---|---|
| 4,877,757 A | 10/1989 | York et al. |
| 4,904,621 A | 2/1990 | Loewenstein et al. |
| 4,913,929 A | 4/1990 | Moslehi et al. |
| 4,940,505 A | 7/1990 | Schachameyer et al. |
| 5,011,789 A | 4/1991 | Burns |
| 5,028,973 A | 7/1991 | Bajor |
| 5,129,958 A | 7/1992 | Nagashima et al. |
| 5,138,973 A | 8/1992 | Davis et al. |
| 5,144,376 A | 9/1992 | Kweon |
| 5,156,820 A | 10/1992 | Wong et al. |
| 5,158,644 A | 10/1992 | Cheung et al. |
| 5,198,634 A | 3/1993 | Mattson et al. |
| 5,211,796 A | 5/1993 | Hansen |
| 5,228,206 A | 7/1993 | Grant et al. |
| 5,248,636 A | 9/1993 | Davis et al. |
| 5,252,841 A | 10/1993 | Wen et al. |
| 5,275,687 A | 1/1994 | Choquette et al. |
| 5,285,089 A | 2/1994 | Das |
| 5,319,220 A | 6/1994 | Suzuki et al. |
| 5,323,032 A | 6/1994 | Sato et al. |
| 5,326,992 A | 7/1994 | Yoder |
| 5,373,806 A | 12/1994 | Logar |
| 5,378,901 A | 1/1995 | Nii |
| 5,380,370 A | 1/1995 | Niino et al. |
| 5,403,434 A | 4/1995 | Moslehi |
| 5,421,957 A | 6/1995 | Carlson et al. |
| 5,422,502 A | 6/1995 | Kovacic |
| 5,425,842 A | 6/1995 | Zijlstra |
| 5,470,799 A | 11/1995 | Itoh et al. |
| 5,496,745 A | 3/1996 | Ryum et al. |
| 5,508,536 A | 4/1996 | Twynam et al. |
| 5,512,772 A | 4/1996 | Maeda et al. |
| 5,517,943 A | 5/1996 | Takahashi |
| 5,557,117 A | 9/1996 | Matsuoka et al. |
| 5,557,118 A | 9/1996 | Hashimoto |
| 5,609,721 A | 3/1997 | Tsukune et al. |
| 5,620,559 A | 4/1997 | Kikuchi |
| 5,670,801 A | 9/1997 | Nakano |
| 5,686,748 A | 11/1997 | Thakur et al. |
| 5,693,147 A | 12/1997 | Ward et al. |
| 5,698,039 A | 12/1997 | Patz et al. |
| 5,729,033 A | 3/1998 | Hafizi |
| 5,759,281 A | 6/1998 | Gurary et al. |
| 5,783,495 A | 7/1998 | Li et al. |
| 5,788,778 A | 8/1998 | Shang et al. |
| 5,859,447 A | 1/1999 | Yang et al. |
| 5,899,752 A | 5/1999 | Hey et al. |
| 5,923,966 A | 7/1999 | Teramoto et al. |
| 5,926,743 A | 7/1999 | Xi et al. |
| 5,986,287 A | 11/1999 | Eberl et al. |
| 5,992,429 A | 11/1999 | Peckman |
| 5,998,305 A | 12/1999 | Holmer et al. |
| 6,008,128 A | 12/1999 | Habuka et al. |
| 6,024,045 A | 2/2000 | Kikuchi et al. |
| 6,031,255 A | 2/2000 | Delage et al. |
| 6,043,519 A | 3/2000 | Shealy et al. |
| 6,049,098 A | 4/2000 | Sato |
| 6,058,945 A | 5/2000 | Fujiyama et al. |
| 6,060,397 A | 5/2000 | Seamons et al. |
| 6,063,300 A | 5/2000 | Suzuki et al. |
| 6,071,823 A | 6/2000 | Hung et al. |
| 6,074,478 A | 6/2000 | Oguro |
| 6,079,426 A | 6/2000 | Subrahmanyam et al. |
| 6,107,192 A | 8/2000 | Subrahmanyan et al. |
| 6,110,289 A | 8/2000 | Moore |
| 6,110,836 A | 8/2000 | Cohen et al. |
| 6,153,529 A | 11/2000 | Agarwal |
| 6,164,295 A | 12/2000 | Ui et al. |
| 6,165,273 A | 12/2000 | Fayfield et al. |
| 6,190,453 B1 | 2/2001 | Boydston et al. |
| 6,197,694 B1 | 3/2001 | Beinglass |
| 6,204,120 B1 | 3/2001 | Gilboa et al. |
| 6,221,168 B1 | 4/2001 | Carter et al. |
| 6,294,466 B1 | 9/2001 | Chang |
| 6,313,042 B1 | 11/2001 | Cohen et al. |
| 6,316,795 B1 | 11/2001 | Croke, III |
| 6,319,861 B1 | 11/2001 | Shih et al. |
| 6,329,297 B1 | 12/2001 | Balish et al. |
| 6,339,028 B2 | 1/2002 | Tesauro |
| 6,346,489 B1 | 2/2002 | Cohen et al. |
| 6,347,636 B1 | 2/2002 | Xia et al. |
| 6,348,125 B1 | 2/2002 | Geusic et al. |
| 6,372,657 B1 | 4/2002 | Hineman et al. |
| 6,374,831 B1 | 4/2002 | Chandran et al. |
| 6,391,796 B1 | 5/2002 | Akiyama et al. |
| 6,395,192 B1 | 5/2002 | Nemirovsky et al. |
| 6,454,854 B1 | 9/2002 | Ose |
| 6,457,478 B1 | 10/2002 | Danese |
| 6,498,107 B1 | 12/2002 | Fenner |
| 6,503,410 B1 | 1/2003 | Blalock et al. |
| 6,534,412 B1 | 3/2003 | Lin |
| 6,566,279 B2 | 5/2003 | Suemitsu et al. |
| 6,593,211 B2 | 7/2003 | Sato |
| 6,810,168 B1 | 10/2004 | Feng et al. |
| 7,008,881 B2 * | 3/2006 | Tamura et al. ............... 438/778 |
| 7,108,748 B2 | 9/2006 | Brabant et al. |
| 7,112,538 B2 * | 9/2006 | Ferro et al. ................. 438/763 |
| 7,462,239 B2 | 12/2008 | Brabant et al. |
| 2001/0032704 A1 | 10/2001 | Tesauro |
| 2002/0106908 A1 | 8/2002 | Cohen et al. |
| 2002/0108930 A1 | 8/2002 | Nemirovsky et al. |
| 2002/0124867 A1 | 9/2002 | Kim et al. |
| 2002/0151156 A1 | 10/2002 | Hallock et al. |
| 2003/0036268 A1 | 2/2003 | Brabant et al. |
| 2003/0060030 A1 | 3/2003 | Lee et al. |
| 2005/0176252 A1 | 8/2005 | Goodman et al. |
| 2008/0289650 A1 | 11/2008 | Arena |

FOREIGN PATENT DOCUMENTS

| | | |
|---|---|---|
| EP | 0291181 A2 | 11/1988 |
| JP | 62-022420 | 1/1987 |
| JP | 64-004015 | 1/1989 |
| JP | 07-153685 | 6/1995 |
| JP | 09-040506 | 2/1999 |

OTHER PUBLICATIONS

Carroll et al., Shortened photoconductance lifetime of Si/SiGe heterostructures due to interfacial oxygen or carbon from incomplete in-situ hydrogen clean, Thin Solid Films, 2005, vol. 473, pp. 137-144.

Friedrich et al., Limitations in low temperature silicon epitaxy due to water vapor and oxygen in the growth ambient, School of Electrical Engineering Purdue University, S.T. Liu Honeywell, Oct. 1988, pp. 2543-2545.

Gruhle et al., Influence of oxygen contamination during Si low pressure vapour phase epitaxy on epitaxial layer quality, Journal of Crystal Growth, 1991, pp. 985-988.

Kim et al., Ex situ wafer surface cleaning by HF dipping for low temperature silicon epitaxy, Thin Solid Films, 1997, pp. 280-285.

Wolansky et al., Low temperature clean for Si/SiGe epitaxy for CMOS integration of heterojunction bipolar transistors, Proceedings of the 8th International Symposium on Silicon Materials Science and Technology, 1989, vol. 1, pp. 812-821.

Wolf et al., Silicon Processing for the VLSI Era vol. 1: Process Technology, Lattice Press, Sunset Beach, CA, USA, 1986, pp. 140-143, 155-156.

Wolf et al., Silicon Processing for the VLSI Era vol. 1: Process Technology, Lattice Press, Sunset Beach, CA, USA, 2000, pp. 225-264.

* cited by examiner

PROCESS AND APPARATUS FOR TREATING WAFERS

CROSS-REFERENCE TO RELATED APPLICATIONS

This application claims priority to U.S. Provisional Patent Application No. 61/053,770, filed May 16, 2008, which is incorporated herein by reference in its entirety.

BACKGROUND OF THE INVENTION

1. Field of the Invention

The present invention relates to treating semiconductor substrates, and more particularly to low pressure bakes and subsequent in-situ epitaxial deposition within a single-wafer chemical vapor deposition (CVD) chamber.

2. Description of the Related Art

High-temperature reactors are used to create structures of very fine dimensions, such as integrated circuits on semiconductor substrates. One or more substrates, such as silicon wafers (which may or may not include previously formed structures thereon or therein), are placed on a substrate support inside the reaction chamber. The substrate is heated to a desired temperature. In a typical treatment step, reactant gases are passed over the heated substrate, causing the CVD of a thin layer of the material derived from the reactant or precursor gases on the substrate. Various process conditions, particularly temperature uniformity and reactant gas distribution, must be carefully controlled to ensure the high quality of the resulting layers.

Through a series of deposition, doping, photolithography and etch steps, the starting substrate and the subsequent layers are converted into integrated circuits, with a single layer producing from tens to thousands or even millions of integrated devices, depending on the size of the substrate and the complexity of the circuits.

Batch processors have traditionally been employed in the semiconductor industry to allow multiple wafers to be processed simultaneously, thus economically presenting low processing times and costs per wafer. Recent advances in miniaturization and attendant circuit density, however, have lowered tolerances for imperfections in semiconductor processing. Accordingly, single wafer processing reactors have been developed for improved control of deposition conditions.

Among other process parameters, single wafer processing has greatly improved temperature and gas flow distribution across the wafer. In exchange for greater process control, however, processing time has become even more critical than with batch systems. Every second added to processing times must be multiplied by the number of wafers being processed serially, one at a time, through the same single-wafer processing chamber. Conversely, any improvements in wafer throughput can translate to significant fabrication cost savings.

One process for which process control is particularly critical, and for which single wafer processing is particularly useful, is the formation of epitaxial layers. If the deposited layer has the same crystallographic structure as the underlying silicon wafer, it is called an epitaxial layer. Through careful control of deposition conditions, reactant gases are passed over a heated substrate such that the deposited species precipitates in conformity with the underlying crystal structure, which is thus extended into the growing layer. The lowest level of devices, including transistors, often include epitaxial layers formed over a single crystal semiconductor substrate.

It is important that the epitaxial layers maintain a pure crystal structure, free of contamination which could affect device operation. The purity and crystalline structure of the underlying substrate prior to epitaxial deposition strongly affects the resultant epitaxial layer. Contaminants at the substrate surface, such as naturally forming "native oxide" and carbon contaminants, interfere with the crystal structure and consequent electrical properties of each overlying layer as it is formed, resulting in a polycrystalline layer. Note that clean, oxide-free semiconductor or conductor surfaces are also desirable for a number of contexts other than epitaxial deposition.

Typically wafers are cleaned prior to deposition with an ammonium hydroxide, hydrogen peroxide mixture, known as an "APM" clean. If an oxide-free surface is required, the silicon wafer is typically dipped into an aqueous solution of hydrofluoric acid or HF vapor treated to etch away the oxide layer left by an APM clean and, theoretically, obtain hydrogen termination. There are a large number of variations on APM clean and hydrofluoric acid treatments. After cleaning, wafers are typically stored for a period of time before further processing. A native oxide tends to form on the previously oxide-free silicon wafer surface almost immediately after exposure to air or moisture. Further, silicon-fluorine and silicon-carbon bonds are often observed on the silicon wafer surface after cleaning. The fluorine and carbon contamination on the surface can be detrimental to the thermal budget and/or the quality of the layer to be grown or deposited on the surface of the wafer.

If the silicon wafer is dipped in hydrofluoric acid as the last cleaning step (also known as an "HF last" treatment), the surface of the silicon is typically terminated mostly with a monolayer of hydrogen, attached to the substrate largely through Si—H bonds. The hydrogen-terminated surface resists oxidation more than untreated silicon. If desired, the hydrogen termination can be removed at temperatures greater than about 500° C. However, the surface of a silicon wafer after a conventional HF last treatment normally starts to reoxidize within about 20 minutes after the original oxide layer was removed, quickly forming a new 5 Å to 7 Å thick oxide layer on the surface of the silicon wafer. Carbon or fluorine termination can better prevent re-oxidation, though this will introduce other problems, such as contamination or difficulty in removing the termination prior to subsequent processing. The problem of reoxidation after the HF last treatment has been detrimental to the high-throughput manufacturing of many silicon devices.

SUMMARY OF THE INVENTION

A need exists, therefore, for methods of purifying substrate surfaces prior to chemical vapor deposition, and of maintaining the purity of a deposited layer after formation. Desirably, such methods should be compatible with single-wafer, epitaxial silicon deposition chambers without increasing system costs or reducing wafer throughput. In some arrangements, these methods should not exhaust the thermal budget for subsequent epitaxial layers. These and other needs are satisfied by several embodiments within the present invention.

In accordance with one aspect of the present invention, a method is provided for treating a semiconductor substrate by loading the substrate onto a substrate support in a chemical vapor deposition reaction chamber and decreasing pressure in the reaction chamber to a bake pressure between about $1 \times 10^{-6}$ Torr and 10 Torr. The method further includes increasing pressure in the reaction chamber from the bake pressure to a deposition pressure and depositing a layer by chemical vapor deposition at the deposition pressure.

Another aspect of the present invention provides a method of cleaning a silicon surface. The method further comprises loading the substrate onto a substrate support in a reaction chamber and introducing a reducing gas to the reaction chamber. The method further comprises, after introducing the reducing gas, decreasing pressure in the reaction chamber to a bake pressure between about $1 \times 10^{-6}$ Torr and 10 Torr while continuing to supply the reducing gas to the reaction chamber.

In accordance with another aspect of the present invention, a system for chemical vapor deposition on a semiconductor substrate is provided. The system comprises a reaction chamber having a volume less than about 100 liters, the reaction chamber comprising a reinforced structure configured to withstand a pressure of less than 5 Torr. The system further comprises a robot configured to transfer a substrate into the reaction chamber and a plurality of heating elements configured to heat the substrate within the reaction chamber. The system further comprises a controller configured to decrease pressure in the reaction chamber and carry out a low pressure bake at a bake pressure between about $1 \times 10^{-6}$ Torr and 4 Torr.

BRIEF DESCRIPTION OF THE DRAWINGS

These and other aspects of the invention will be readily apparent to the skilled artisan from the following description and the attached drawings, wherein.

DETAILED DESCRIPTION OF THE PREFERRED EMBODIMENT

While the preferred embodiments of the present invention are discussed in the context of a single-substrate reaction chamber, the skilled artisan will appreciate that the principles and advantages taught herein will have application to deposition reactors of other types. Furthermore, while a series of process steps are disclosed herein, one of ordinary skill in the art will recognize the utility of certain of the disclosed steps even in the absence of some of the other disclosed steps.

A system and methods are provided for low temperature, rapid baking to remove impurities from a semiconductor surface prior to in-situ deposition. Advantageously, a short, low temperature process consumes very little of the thermal budget and also improves throughput. Although embodiments of the present invention are illustrated with reference primarily to chemical vapor deposition (CVD), one skilled in the art will understand that atomic layer deposition (ALD) would also be suitable. In addition, while the embodiments are described with reference to wafers or semiconductor surfaces, the skilled artisan will understand that other substrates with a silicon-containing surface on which a layer is to be deposited can also be used. The skilled artisan will also understand that although the figures and the description depict a wafer that has not been patterned, processes described herein can also be performed using wafers that have been patterned.

Figure 1A:
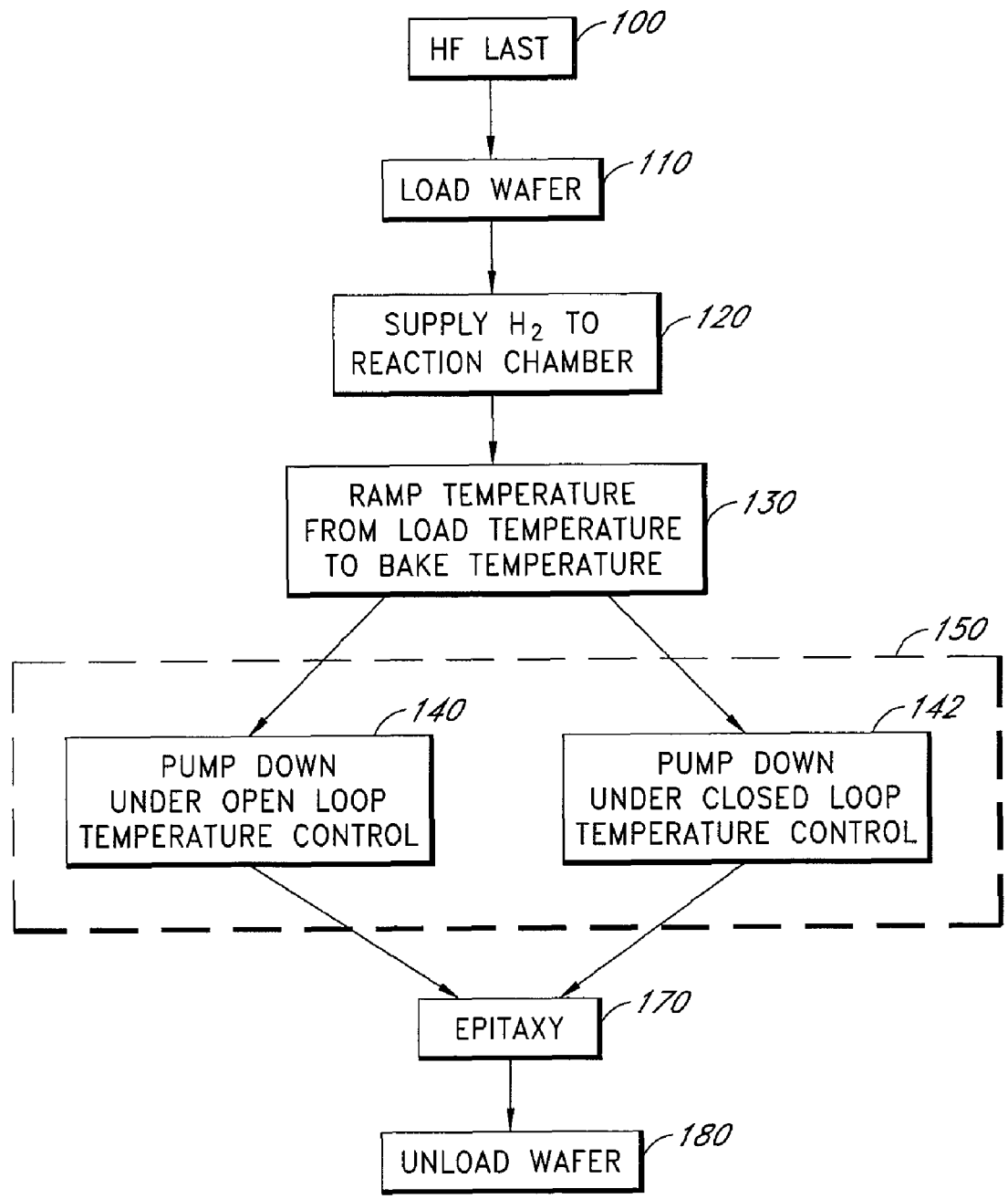
FIG. 1A is a flow chart generally illustrating a process in accordance with embodiments of the present invention.
Figure 5A:
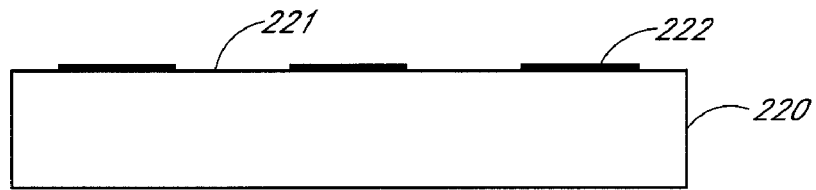
FIG. 5A is a schematic cross-sectional view of a wafer before treatment in accordance with embodiments of the present invention.

FIG. 1A generally illustrates a process for treating a substrate with a silicon-containing major surface. FIG. 1A shows a process beginning with an HF last treatment 100 to terminate the silicon at the major surface with hydrogen. However, an HF last treatment is not essential, and other processes for cleaning the surface may be performed before the HF last. For example, the substrate may be cleaned with an ammonium hydroxide/hydrogen peroxide mixture (APM), such as described in U.S. Pat. No. 7,108,748, issued Sep. 19, 2006, entitled "LOW TEMPERATURE LOAD AND BAKE." Even if such an APM clean and/or other cleaning processes are carried out, an oxide layer 222 is typically present on the surface 221 of the substrate 220 afterwards, as shown in FIG. 5A. The HF last treatment 100 removes this oxide layer 222, albeit only temporarily, and provides a hydrogen termination on the surface 221.

An exemplary dilute (aqueous) hydrofluoric acid used for the HF last treatment 100 has a concentration of approximately 0.5% to 1.0% by weight (wt %) hydrogen fluoride, and more particularly about 0.5 wt % HF. Use of a dilute hydrofluoric acid for the etch treatment 100 minimizes contamination on the surface of the silicon wafer. The dilute hydrofluoric acid is preferably heated to a temperature of about 35° C. to 60° C., and more preferably at about 50° C., to minimize particles and to enhance hydrogen termination on the surface of the silicon wafer. The heated dilute hydrofluoric acid etch also provides for uniform oxide etch rates on the entire surface of the silicon wafer. In an exemplary procedure, the silicon wafer is etched with dilute hydrofluoric acid having a concentration of approximately 0.5 wt % hydrogen fluoride at a temperature of approximately 50° C. for approximately 60 seconds.

In an embodiment, the substrate is dipped in an aqueous or wet HF bath, but HF vapor can also be employed in other arrangements. The ultrapure water which is used to form the dilute hydrofluoric acid in the etch bath has high resistivity, indicating that the metals levels are low. The water which is used to form the dilute hydrofluoric acid in the etch bath has a resistivity greater than about 15 megaohms-cm (MΩ-cm) at a temperature of 25° C. In one embodiment, the resistivity is at least about 18 MΩ-cm. The total organic carbon (TOC) and the dissolved silica are also preferably minimized to levels of less than 10 ppb (parts per billion).

In an embodiment, the hydrofluoric acid which is used to form the dilute hydrofluoric acid in the etch bath is gigabit grade (on the order of parts per trillion impurities) hydrofluoric acid with low levels of particles and dissolved metals, commercially available as Part No. 107101 in a 49% solution from Alameda Chemical of Tempe, Ariz., (480) 785-4685.

Following the HF last treatment 100, the substrate is delivered into a reaction chamber by loading 110, as shown in FIG. 1A. In an embodiment, the reaction chamber comprises a single-substrate, horizontal flow, cold-wall reactor. As noted above, single wafer processing tools generally demonstrate greater process control and uniformity than traditional batch systems. However, as only one or at best a handful of substrates can be processed at one time, the gains in uniformity and process control come at the expense of throughput. The volume of the single-substrate process chamber can be different, depending upon the size of the wafers meant to be processed therein. For example, a single-substrate processing chamber for 300 mm wafers may have a capacity of less than about 100 liters, particularly less than about 30 liters. The total volume capacity of single wafer process chambers designed for processing 200 mm wafers may less than about 30 liters, particularly less than about 10 liters. It will be appreciated that the "effective" volume of these chambers (the volume above dividers through which process gases flow) is approximately half the total volume of the chamber. Single-substrate processing chambers of these sizes are more fully described in U.S. Pat. No. 6,749,687, issued Jun. 15, 2004, entitled "IN SITU GROWTH OF OXIDE AND SILICON LAYERS," describing the EPSILON® family of single wafer epitaxial deposition tools, commercially available from ASM America, Inc. of Pheonix, Ariz. The skilled artisan will appreciate that the volume will scale up in transition from 300-mm to 450-mm wafers.

The EPSILON® single-pass horizontal flow design also enables laminar flow of reactant gases with low residence times which, in turn, facilitates sequential processing while minimizing reactant interaction with each other and with chamber surfaces. Such a laminar flow enables sequentially flowing reactants that might react with each other. Reactions to be avoided include highly exothermic or explosive reactions and reactions that produce particulate contamination of the chamber. Additionally, the chamber facilitates rapidly purging the chamber between processes, such as purging the chamber of air and moisture after loading a substrate onto the susceptor.

A CVD reactor including a quartz process, or reaction, chamber has particular utility for the methods disclosed herein. Such a reactor can safely and cleanly accomplish multiple treatments sequentially in the same chamber. Because of the low pressures of the processes described herein, reaction chambers may need to be structurally reinforced. For example, quartz chambers may include a plurality of ribs to support the pressure exerted by atmospheric air outside of the chamber during a reduced pressure CVD process. In one embodiment, the reaction chamber is configured to withstand internal pressures of 5 Torr or less. Another embodiment provides a reaction chamber configured to withstand internal pressures of $1 \times 10^{-2}$ Torr or less. A more heavily reinforced reaction chamber can be configured to withstand internal pressures down to about $1 \times 10^{-6}$ Torr. Additionally, the reaction chamber should be substantially impermeable to leaks at such low pressures, such as leaking $10^{-9}$ atm-cc/sec or less. An exemplary reactor in accordance with embodiments of the present invention is commercially used in the EPSILON® 3200 product from ASM America, Inc. of Phoenix, Ariz.

In order to facilitate the loading 110, a robot may be used for transferring the wafer from outside of the chamber into the chamber and onto a substrate support structure. In some embodiments, loading 110 includes opening a gate valve to the reaction chamber, inserting the robot carrying the wafer into the reaction chamber, allowing the robot to drop the wafer onto the support structure, withdrawing the robot from the reaction chamber, and closing the gate valve. The support structure may include a substrate holder, upon which the wafer rests, and a support spider for supporting the substrate holder. The spider is mounted to a shaft, which extends downwardly through an opening in the lower chamber wall.

In one embodiment, the cold wall reactor has a substrate holder that is a "susceptor" or absorber of radiant heat energy. Typical susceptors are formed of SiC or SiC-coated graphite, and may include a pocket sized to fit a 200-mm or a 300-mm wafer (or in the future a 450-mm wafer) with less than about 1 mm clearance around the wafer edge. In other arrangements, the susceptor can be designed to support wafers of other sizes. In one embodiment, the susceptor may be a standard susceptor, with a mass greater than the wafer it is designed to support. Such standard susceptors can have a thermal mass greater than about three times the thermal mass of the wafer to be supported. The susceptor may be maintained at a temperature between 600° C. and 800° C. when the wafer is loaded, more particularly between 650° C. and 750° C.

In some embodiments, a reducing agent is supplied to the reaction chamber while the wafer is being loaded, before the door of the reaction chamber is closed. The reducing agent removes or slows the formation of interfacial oxygen on the surface of the wafer. In the process illustrated in FIG. 1A, supplying 120 includes supplying hydrogen gas to the reaction chamber at a rate of between about 1 and 80 standard liters per minute (slm). Depending upon pump capacity and strength of the chamber, extremely high flow rates will have a tendency raise the chamber pressure. The skilled artisan will readily appreciate, in view of the disclosure herein, that for other hardware arrangements the optimal range can be determined setting one of the variables (e.g., pressure) and varying the other (e.g., reducing gas flow rate) to determine the effect upon interfacial oxygen. While the illustrated embodiment employs hydrogen gas, other reducing gases may be employed in addition to or as an alternative to hydrogen gas.

FIG. 1A shows supplying 120 of hydrogen gas to the reaction chamber after the loading 110, but supplying 120 may begin before the gate valve to the chamber is closed, and may begin before loading 110, so that the wafer is loaded into a reducing gas environment. Other embodiments may not provide a reducing gas environment in the reaction chamber. In those embodiments that do provide a reducing gas environment, the reducing gas may be supplied at other stages of the process, such as after the wafer is loaded but before the pump down begins or while the pump down is occurring. The flow rate of hydrogen gas being supplied to the reaction chamber may vary at different stages of the process. For example, when the total pressure in the reaction chamber is reduced, a reduced flow rate, such as between about 5 and 20 slm, may be supplied in order to aid the pump down and maintenance of the reaction chamber to a low pressure.

After loading 110, a temperature ramp 130 increases temperature of the substrate from a load temperature to an initial bake temperature. The load temperature is the temperature of the susceptor or substrate support while the substrate is being loaded, and the bake temperature is the temperature of the substrate while it is undergoing the low pressure bake. The bake temperature can vary over time, as the substrate temperature can fluctuate during the low pressure bake 150. The temperature ramp 130 may increase temperature of the substrate by between about 0° C. and 100° C., more particularly by between about 25° C. and 75° C. In the embodiments illustrated in FIGS. 2-3, the load temperature is 700° C. and the temperature ramp 130 increases the temperature of the substrate by 50° C. to the initial bake temperature of 750° C., preferably over a ramp time between about 20-30 seconds (1.7-2.5° C./sec ramping).

Following the temperature ramp 130, the low pressure bake 150 begins when a pump down reduces pressure in the reaction chamber. Reducing pressure in the reaction chamber enables a low pressure bake of the wafer, which advantageously cleans oxide growth from the wafer quickly and at a minimal cost to the thermal budget. Without limiting the disclosure by theory, it is believed that the low pressure bake reduces a boundary layer over the wafer, thereby facilitating the movement of hydrogen to the surface of the wafer.

Figure 5B:
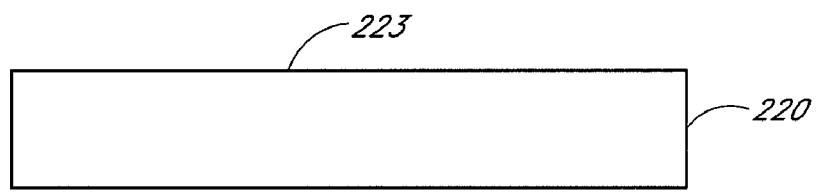
FIG. 5B is a schematic view of a wafer after cleaning in accordance with embodiments of the present invention.
Figure 5C:
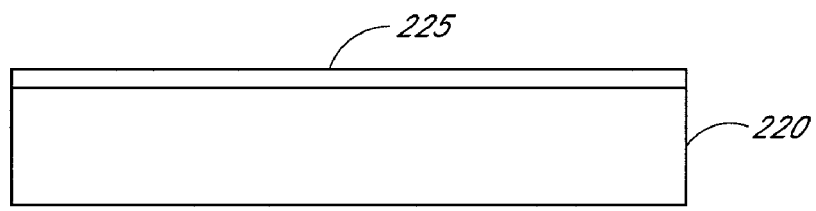
FIG. 5C is a schematic view of a wafer after epitaxy in accordance with embodiments of the present invention.

Even when an APM clean, an HF last, and/or other cleaning processes are performed prior to loading the wafer into the reaction chamber, an oxide layer 222 typically grows again on the surface 221 in the time interval between completing the cleaning process and loading the wafer, as shown in FIG. 5A. The low pressure bake substantially eliminates oxides on the major surface 221 of the wafer such that the wafer 220 thereafter has a cleaned surface 223, as shown in FIG. 5B. In one embodiment, the cleaned wafer surface 221 has a level of oxygen that cannot be detected using secondary mass spectroscopy with an instrument background level less than or equal to about $5\times10^{17}$ atoms per $cm^3$. Following the low pressure bake, an epitaxial CVD process may be performed, thereby forming an epitaxial layer 225 on the wafer 220, as shown in FIG. 5C.

In some arrangements, such as when the wafer is loaded from an environment at atmospheric pressure, the reaction chamber pressure before the low pressure bake 150 begins is substantially at atmospheric pressure. In other arrangements, such as when the wafer is loaded into the reaction chamber from a pressurized loading station, the pressure within the reaction chamber before the pump down may be less than or greater than atmospheric pressure. After the pump down, the pressure in the reaction chamber is at a pressure suitable for carrying out the low pressure bake 150. In one embodiment, the bake pressure is between about $1\times10^{-6}$ Torr and 10 Torr. In another embodiment, the bake pressure is between about $1\times10^{-3}$ Torr and 4 Torr. In still another embodiment, the bake pressure is between about 0.01 Torr and 3 Torr.

The pump down may be implemented by a vacuum pump, particularly a high capacity vacuum pump capable of reducing pressure quickly, thus conserving the thermal budget. The vacuum pump may be capable of reducing pressure within the reaction chamber from atmospheric or greater to 1 Torr or less in less than 60 seconds, more particularly from atmospheric or greater to $1\times10^{-3}$ Torr or less in 40 seconds or less. Examples of commercially available vacuum pumps with these capabilities are the 1800 Series Semiconductor Drypumps available from BOC Edwards of West Sussex, United Kingdom.

FIG. 1A shows that the low pressure bake 150 can be carried out in an open loop temperature control mode 140 or a closed loop temperature control mode 142. In the open loop mode 140, a controller supplies power to heating elements that heat the reactor independently of temperature readings within the chamber. In some embodiments, the controller uses a setpoint that maintains a substantially constant power supply to the heating elements during the low pressure bake 150.

The open loop control mode 140 provides a constant and relatively low wafer temperature during the low pressure bake. In one embodiment, during the low pressure bake in the open loop mode 140, the substrate temperature increases by less than 40° C. from the initial bake temperature (750° C. in the illustrated embodiments). In another embodiment, the substrate temperature increases by less than 20° C. during the low pressure bake. Maintaining temperature uniformity across the surface of the substrate is also important in wafer treatment processes. Accordingly, in one embodiment, the low pressure bake in the open loop mode 140 maintains a temperature range ($\Delta T$) across the surface of the substrate of less than 80° C. In another embodiment, the low pressure bake in the open loop mode 140 maintains a $\Delta T$ of less than 60° C. Another aspect of the open loop mode 140 is that it provides a short bake time, albeit longer than some bake times of the closed loop mode 142. In the open loop mode 140, the time interval from when the pressure begins to decrease until deposition begins may be between 90 seconds and 240 seconds, more particularly between 110 seconds and 190 seconds.

In the closed loop mode 142, the controller seeks to achieve a temperature setpoint by supplying power to the heating elements based on feedback from temperature sensors in the reaction chamber. Carrying out a low pressure bake in the closed loop mode 142 provides a rapid temperature increase. In some embodiments, the temperature increases to between about 750° C. and 900° C., more particularly to between about 800° C. and 850° C. In some processes, the controller's temperature setpoint during the low pressure bake 150 remains substantially the same (e.g., 750° C.) as it was after the temperature ramp 130, but the actual temperature of the substrate increases. In other processes, the temperature setpoint increases during the low pressure bake, but the actual increase in substrate temperature exceeds the increased temperature setpoint. Because this temperature spike occurs during the low pressure bake 150, this entire range is considered to be the bake temperature for purposes of the present disclosure.

Without limiting the disclosure by theory, it is believed that the rapid temperature increase in the closed loop mode 142 results from a reduced heat transfer between the substrate and the temperature sensors, which is, in turn, caused by the diminished availability of gases for convection. The gas availability is diminished because gases have been evacuated during the pump down 130. Accordingly, the controller attempts to compensate for the lower temperature being erroneously detected by the sensors by rapidly ramping power supply to the heaters, thereby overshooting the temperature setpoint. Thus, it is believed that the relationship between the temperature and the pressure in the closed loop mode 142 is that the low pressure in the reaction chamber causes the controller to temporarily increase the temperature. Because rapid temperature increase is more important than precise temperature control or tracking for the purposes of a brief oxide reduction process, the temporary inaccuracy in temperature control is an acceptable trade-off.

A low pressure bake in the closed loop mode 142 can be effective even when very brief, which preserves the thermal budget. In one embodiment, the time interval from beginning to decrease pressure until beginning to deposit a layer on the substrate is less than 60 seconds. In another embodiment, the time interval from beginning to decrease pressure until beginning to deposit a layer on the substrate is less than 40 seconds. The closed loop mode 142 also promotes temperature uniformity across the major surface of the substrate. In one embodiment, the range of temperatures ($\Delta T$) across the surface of the substrate during the low pressure bake in closed loop mode 142 is less than 50° C. In another embodiment, the $\Delta T$ across the surface of the substrate during the low pressure bake in closed loop mode is less than 30° C.

In the process shown in FIG. 1A, hydrogen gas may continue to be supplied during the low pressure bake 150, or enough hydrogen may be provided before the pump down to suffice for the entire low pressure bake 150. As noted above, other embodiments may provide a reducing gas other than hydrogen gas.

Following the low pressure bake 150, FIG. 1A shows carrying out an epitaxy 170 on the wafer. The methods described herein are particularly suited for epitaxial CVD, but other processes of depositing a layer on the major surface can also be used. After the low pressure bake 150, the controller will reduce power supply to the heaters to provide a wafer temperature that is suitable for the desired process. In some embodiments, such as when relatively low temperature epitaxy is carried out, the temperature is decreased to between 300° C. and 750° C., and in one embodiment to between 500° C. and 700° C. After the epitaxial CVD 170 and any other desired processes are carried out on the wafer, unloading 180 removes the wafer from the reaction chamber. The wafer removed from the reaction chamber includes a silicon-containing major surface that has had oxides reduced to silicon, leaving a cleaned semiconductor surface for subsequent epitaxial deposition.

Figure 1B:
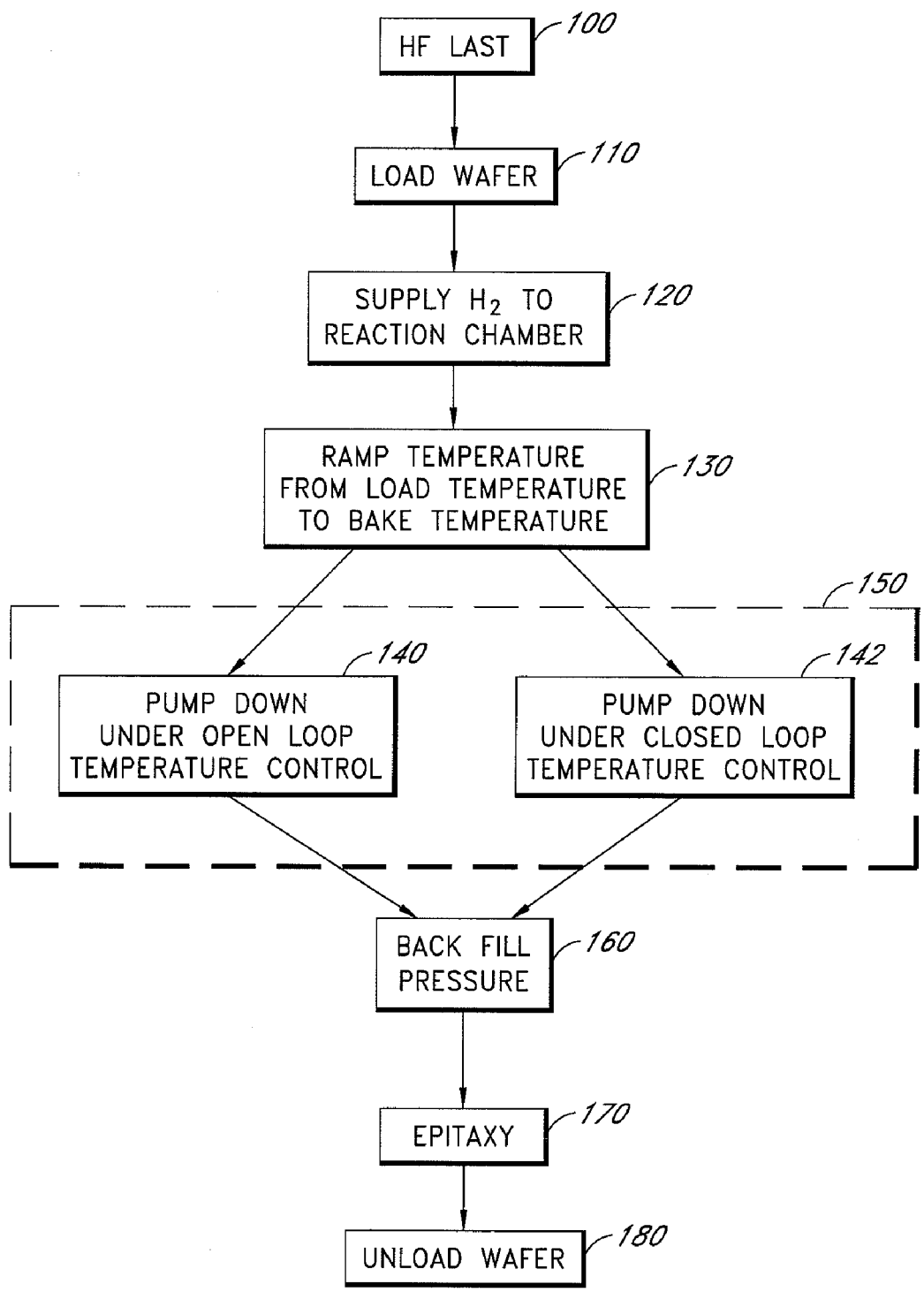
FIG. 1B is a flow chart generally illustrating another process in accordance with embodiments of the present invention.

FIG. 1B shows another process for cleaning wafers having a silicon-containing major surface. In the process illustrated in FIG. 1B, following the low pressure bake 150, a pressure backfill 160 increases the pressure within the reaction chamber to a deposition pressure, which is the pressure suitable for the desired subsequent deposition process. When the desired process is an epitaxy 170, as illustrated in FIG. 1B, the pressure backfill 160 may increase pressure to a deposition pressure between about 1 Torr and 100 Torr, particularly to between about 5 Torr and 50 Torr. After the epitaxy 170, the substrate can be removed by unloading 180.

Figure 2:
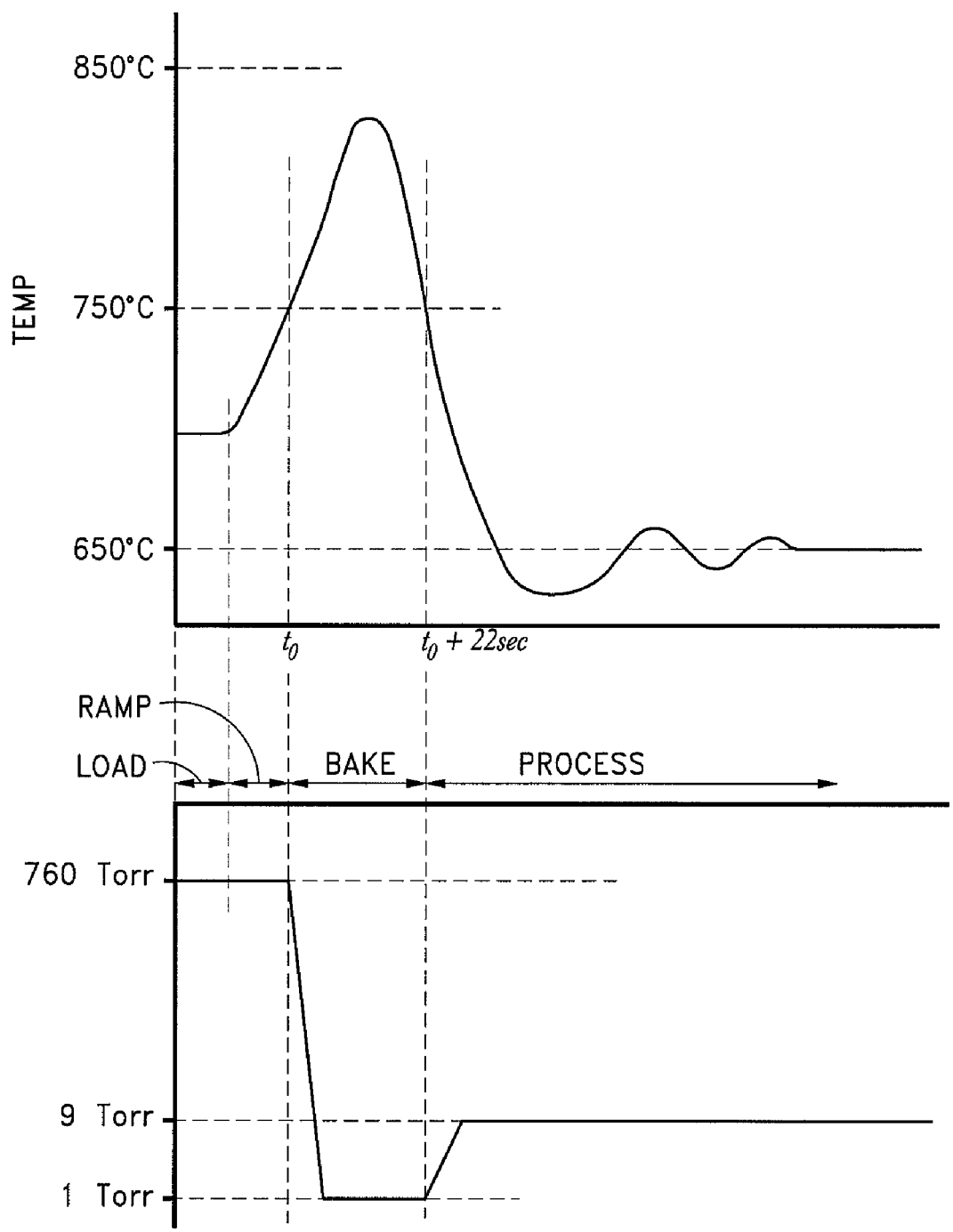
FIG. 2 is a plot illustrating substrate temperature and reaction chamber pressure in certain embodiments of the present invention.

FIG. 2 shows plots of substrate temperature and chamber pressure in an exemplary process according to embodiments of the present invention. The process illustrated in FIG. 2 exemplifies a low pressure bake under closed loop temperature control as illustrated in FIG. 1B, wherein pressure in the reaction chamber is backfilled after the low pressure bake. As can be seen in the first stage of FIG. 2, the temperature read by the sensors surrounding the wafer support remains substantially constant as the wafer is loaded into the reaction chamber at atmospheric pressure. When the wafer is loaded, the load temperature is about 700° C. Next the wafer is heated during the temperature ramp to the initial bake temperature of about 750° C. Next, the reaction chamber is quickly pumped down to about 1 Torr and the wafer experiences a rapid temperature spike to approximately 830° C. The temperature control system then begins to stabilize and return to the setpoint temperature (750° C. in the illustrated embodiment). The wafer temperature returns to about 750° C. approximately 22 seconds after the pump down began. Following the low pressure bake, the pressure in the reaction chamber and the substrate temperature are optimized for the desired process. In the illustrated embodiment, the reaction chamber pressure is backfilled to about 9 Torr and the wafer temperature setpoint is reduced. The actual wafer temperature is shown oscillating briefly before stabilizing at about 650° C.

Figure 3:
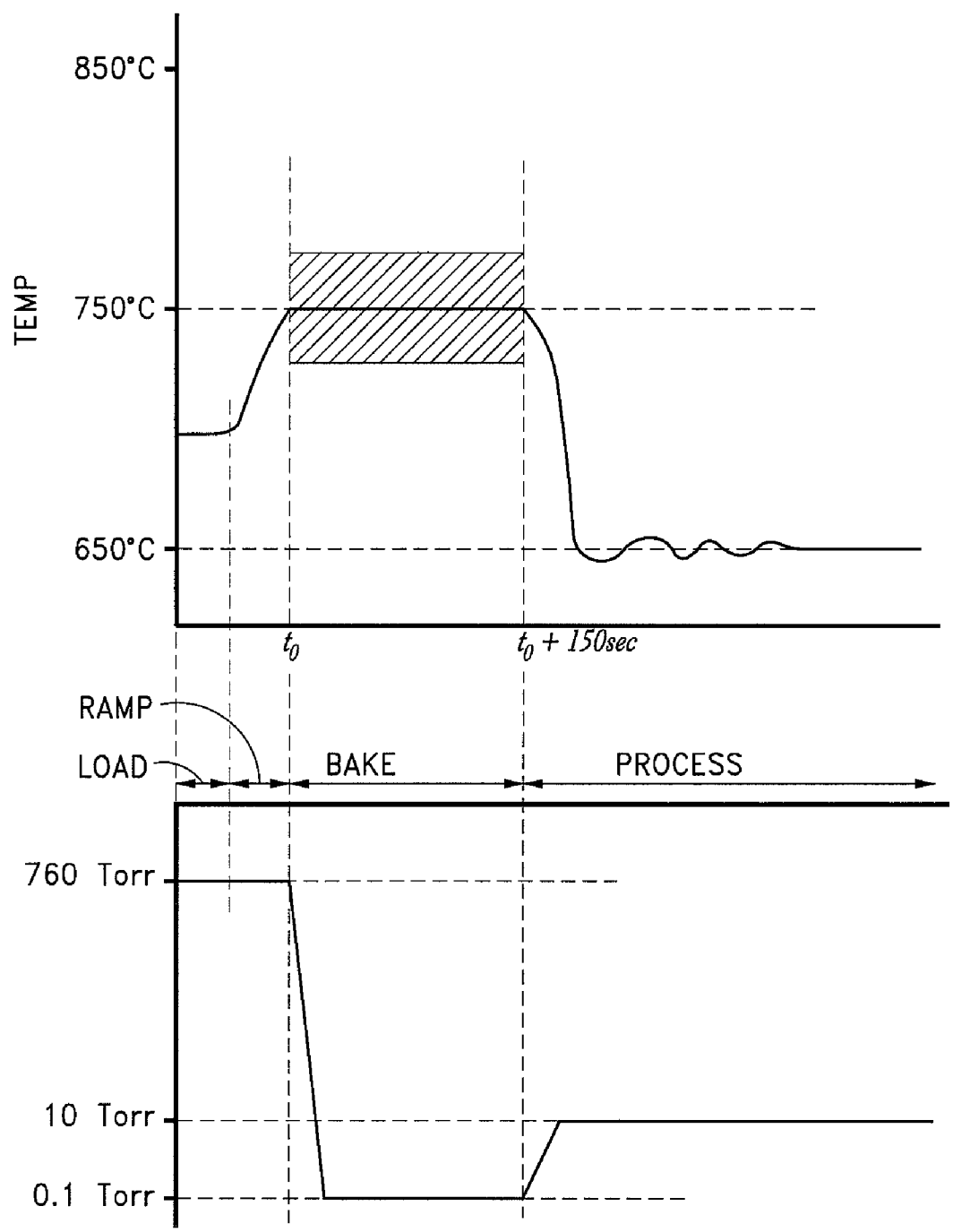
FIG. 3 is a plot illustrating substrate temperature and reaction chamber pressure in accordance with other embodiments of the present invention.

FIG. 3 shows temperature and pressure in another exemplary process. FIG. 3 illustrates an exemplary low pressure bake process under open loop temperature control, again as illustrated in FIG. 1B, wherein pressure in the reaction chamber is backfilled after the low pressure bake. The first stage of FIG. 3 shows that temperature remains substantially constant while the wafer is loaded at a load temperature of about 700° C., and then temperature is ramped to an initial bake temperature of about 750° C. The pump down then begins, decreasing pressure in the reaction chamber to about 0.1 Torr. Meanwhile, the controller supplies a fixed power to radiant heaters outside the reaction chamber, thereby maintaining a substantially constant wafer temperature during the low pressure bake. The shaded region in the temperature plot indicates that the range of temperatures at different portions of the wafer's surface during the low pressure bake is between approximately 725° C. and 775° C. The low pressure bake lasts for about 150 seconds. The pressure is then backfilled to about 10 Torr and the wafer temperature is reduced to about 650° C. for the subsequent low temperature epitaxial CVD process.

Figure 4:
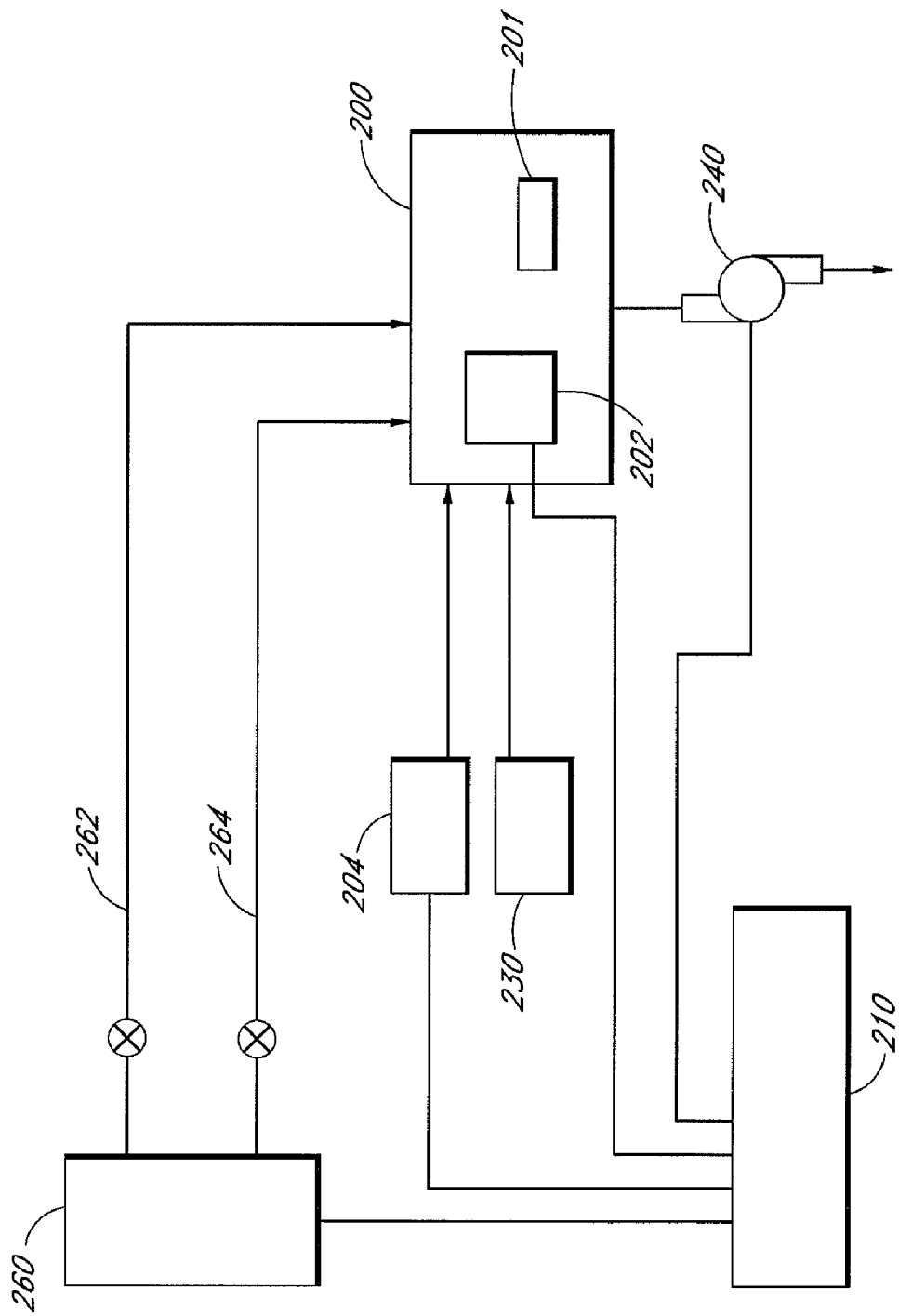
FIG. 4 is a schematic diagram of a bake and CVD reaction apparatus in accordance with embodiments of the present invention.

FIG. 4 is a schematic diagram for a CVD system in accordance with embodiments of the present invention. A reaction chamber 200 and a wafer support 201 therein can be as described above. A robot 230 transfers the wafer into the reaction chamber 200 and a vacuum pump 240 is configured to quickly evacuate gases from the reaction chamber 200. Temperature in the reaction chamber 200 can be adjusted by heating elements 202 within the reaction chamber 200. In other embodiments, radiant heat lamps 204 outside of the chamber 200 can heat the substrate largely independently of the pressure in the chamber 200.

A controller 210 is in communication with the heating elements 202 and/or heat lamps 204, such that the controller can command the heating elements 202 and/or heat lamps 204 to increase or decrease their output. The controller 210 may be programmed to carry out low pressure bakes as described above, such as an open loop control low pressure bake or a closed loop control low pressure bake. As such, the controller 210 may also be in communication with the vacuum pump 240 and a gas panel 260. The gas panel may house valves for a reducing vapor supply line 262 and one or more semiconductor precursor supply lines 264, each discharging into the reaction chamber 200. Accordingly, the controller 210 can selectively introduce a reducing agent, such as hydrogen gas, and a silicon source gas into the reaction chamber 200.

The processes described herein can enable a low temperature and rapid hydrogen bake while still providing very clean, oxide-free silicon surfaces for subsequent deposition. Furthermore, the combination of the described low pressure bake with relatively low temperature deposition, conducted in-situ, allows for other considerable improvements in wafer throughput, lowering overall costs of operation.

It will be appreciated by those skilled in the art that various modifications and changes can be made without departing from the scope of the invention. Such modifications and changes are intended to fall within the scope of the invention, as defined by the appended claims.

What is claimed is:

1. A method of treating a semiconductor substrate, comprising:
    loading the substrate onto a substrate support in a chemical vapor deposition reaction chamber;
    decreasing pressure in the reaction chamber to a bake pressure between about $1 \times 10^{-6}$ Torr and 10 Torr;
    increasing pressure in the reaction chamber from the bake pressure to a deposition pressure; and
    depositing a layer by chemical vapor deposition at the deposition pressure.

2. The method of claim 1, wherein decreasing pressure comprises decreasing pressure to between about $1 \times 10^{-3}$ Torr and 4 Torr.

3. The method of claim 1, wherein increasing pressure comprises increasing pressure to between about 1 Torr and 100 Torr.

4. The method of claim 1, wherein loading the substrate comprises loading the substrate into the chamber at approximately atmospheric pressure.

5. The method of claim 1, further comprising providing a reducing gas environment in the reaction chamber at the bake pressure.

6. The method of claim 5, further comprising introducing the reducing gas environment into the reaction chamber prior to decreasing pressure.

7. The method of claim 1, further comprising increasing a temperature of the substrate to between about 750° C. and 900° C. beginning while decreasing pressure in the reaction chamber.

8. The method of claim 1, wherein increasing the temperature of the substrate comprises maintaining a temperature range across the surface of the substrate of less than 30° C.

9. The method of claim 7, wherein a time interval from beginning decreasing pressure in the reaction chamber until beginning depositing the layer is less than 40 seconds.

10. The method of claim 7, wherein increasing the temperature of the substrate comprises controlling the temperature with a closed feedback loop and keeping constant a temperature setpoint.

11. The method of claim 7, further comprising, after increasing the temperature of the substrate, decreasing the temperature of the substrate to between about 300° C. and 750° C.

12. The method of claim 11, wherein depositing the layer by chemical vapor deposition comprises epitaxy.

13. The method of claim 1, wherein decreasing pressure comprises maintaining a substantially constant power setpoint to heaters heating the reaction chamber.

14. The method of claim 13, wherein maintaining a substantially constant power setpoint comprises controlling the heaters in a fixed power, open loop control mode.

15. The method of claim 14, wherein decreasing pressure comprises increasing a temperature of the substrate by less than 40° C.

16. The method of claim 14, wherein decreasing pressure comprises maintaining a temperature range across the surface of the substrate of less than 60° C.

17. The method of claim 1, further comprising terminating silicon at the surface of the substrate with hydrogen before loading the substrate into the chamber, wherein terminating the surface comprises an HF last.

18. The method of claim 17, wherein chemical vapor deposition comprises an epitaxial process.

19. A method of treating a silicon surface, comprising:
loading a substrate onto a substrate support in a reaction chamber;
introducing a reducing gas to the reaction chamber; and
after introducing the reducing gas, decreasing pressure in the reaction chamber to a bake pressure between about $1 \times 10^{-6}$ Torr and 10 Torr while continuing to supply the reducing gas to the reaction chamber.

20. The method of claim 19, wherein decreasing pressure in the reaction chamber comprises decreasing pressure to between about $1 \times 10^{-2}$ Torr and 3 Torr.

21. The method of claim 19, wherein loading the substrate comprises loading into the reaction chamber at approximately atmospheric pressure.

22. The method of claim 19, wherein decreasing pressure comprises increasing a temperature of the substrate from an initial bake temperature to an increased bake temperature, wherein the initial bake temperature is between about 700° C. and 800° C. and the increased bake temperature is between about 750° C. and 900° C.

23. The method of claim 22, further comprising, after increasing the temperature of the substate, decreasing the temperate of the substrate to between about 500° C. and 700° C.

24. The method of claim 19, wherein decreasing pressure comprises maintaining a substantially constant power setpoint to heaters in the reaction chamber.

25. The method of claim 24, wherein decreasing pressure causes increasing a temperature of the substrate by greater than 0° C. and less than 20° C.

* * * * *